US010830857B2

(12) United States Patent
Kimmlingen et al.

(10) Patent No.: US 10,830,857 B2
(45) Date of Patent: Nov. 10, 2020

(54) MRT AND METHOD FOR OPERATING A CLINICAL PTX SYSTEM

(71) Applicants: Ralph Kimmlingen, Zirndorf (DE); Norbert Rietsch, Dormitz (DE)

(72) Inventors: Ralph Kimmlingen, Zirndorf (DE); Norbert Rietsch, Dormitz (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 1470 days.

(21) Appl. No.: 14/819,418

(22) Filed: Aug. 5, 2015

(65) Prior Publication Data
US 2016/0041250 A1 Feb. 11, 2016

(30) Foreign Application Priority Data
Aug. 6, 2014 (DE) .......................... 10 2014 215 531

(51) Int. Cl.
*A61B 5/00* (2006.01)
*G01R 33/58* (2006.01)
(Continued)

(52) U.S. Cl.
CPC ......... *G01R 33/583* (2013.01); *G01R 33/288* (2013.01); *G01R 33/3415* (2013.01); *G01R 33/246* (2013.01)

(58) Field of Classification Search
None
See application file for complete search history.

(56) References Cited

U.S. PATENT DOCUMENTS

2005/0127914 A1 6/2005 Eberler et al.
2008/0024129 A1* 1/2008 Heid ...................... G01R 33/54
324/307

(Continued)

FOREIGN PATENT DOCUMENTS

DE 10314215 B4 11/2006
WO WO2013105006 A1 7/2013

OTHER PUBLICATIONS

German Office Action for related German Application No. 10 2014 215 531.2, dated Mar. 26, 2015, with English Translation.

*Primary Examiner* — Joel F Brutus
(74) *Attorney, Agent, or Firm* — Lempia Summerfield Katz LLC

(57) ABSTRACT

A method and a magnetic resonance tomography (MRT) system are provided. The MRT system includes a controller configured to store a transmit vector that is established on a local-coil-specific basis. The transmit vector, for a specific local coil, indicates with which amplitudes and phases, transmit elements of the local coil may be controlled by a transmit device. The controller is configured to initiate a patient-specific calibration measurement on a patient to generate patient-specific calibration data representing a field distribution. The controller is also configured to determine deviations in the patient-specific calibration data from the stored transmit vector established on a local-coil-specific basis. The patient-specific calibration data is generated in the patient-specific calibration measurement on the patient and represents a field distribution. An imaging MRT measurement is not allowed if deviations exceed a threshold value, but is otherwise performed and is monitored by a monitoring device.

18 Claims, 3 Drawing Sheets

(51) Int. Cl.
G01R 33/3415 (2006.01)
G01R 33/28 (2006.01)
G01R 33/24 (2006.01)

(56) References Cited

U.S. PATENT DOCUMENTS

2010/0308825 A1* 12/2010 Brinker ................ G01R 33/288
 324/309
2010/0327868 A1* 12/2010 Gebhardt ............. G01R 33/288
 324/307

* cited by examiner

MRT AND METHOD FOR OPERATING A CLINICAL PTX SYSTEM

This application claims the benefit of DE 10 2014 215 531.2, filed on Aug. 6, 2014, which is hereby incorporated by reference in its entirety.

BACKGROUND

The present embodiments relate to a magnetic resonance tomography system and a method for the operation thereof.

Magnetic resonance devices (MRTs) for examining objects or patients using magnetic resonance tomography are known, for example, from DE 103 14 215 B4.

SUMMARY

The scope of the present invention is defined solely by the appended claims and is not affected to any degree by the statements within this summary.

The present embodiments may obviate one or more of the drawbacks or limitations in the related art. For example, a magnetic resonance tomography system and a method for the operation thereof are optimized.

DETAILED DESCRIPTION

Figure 3:
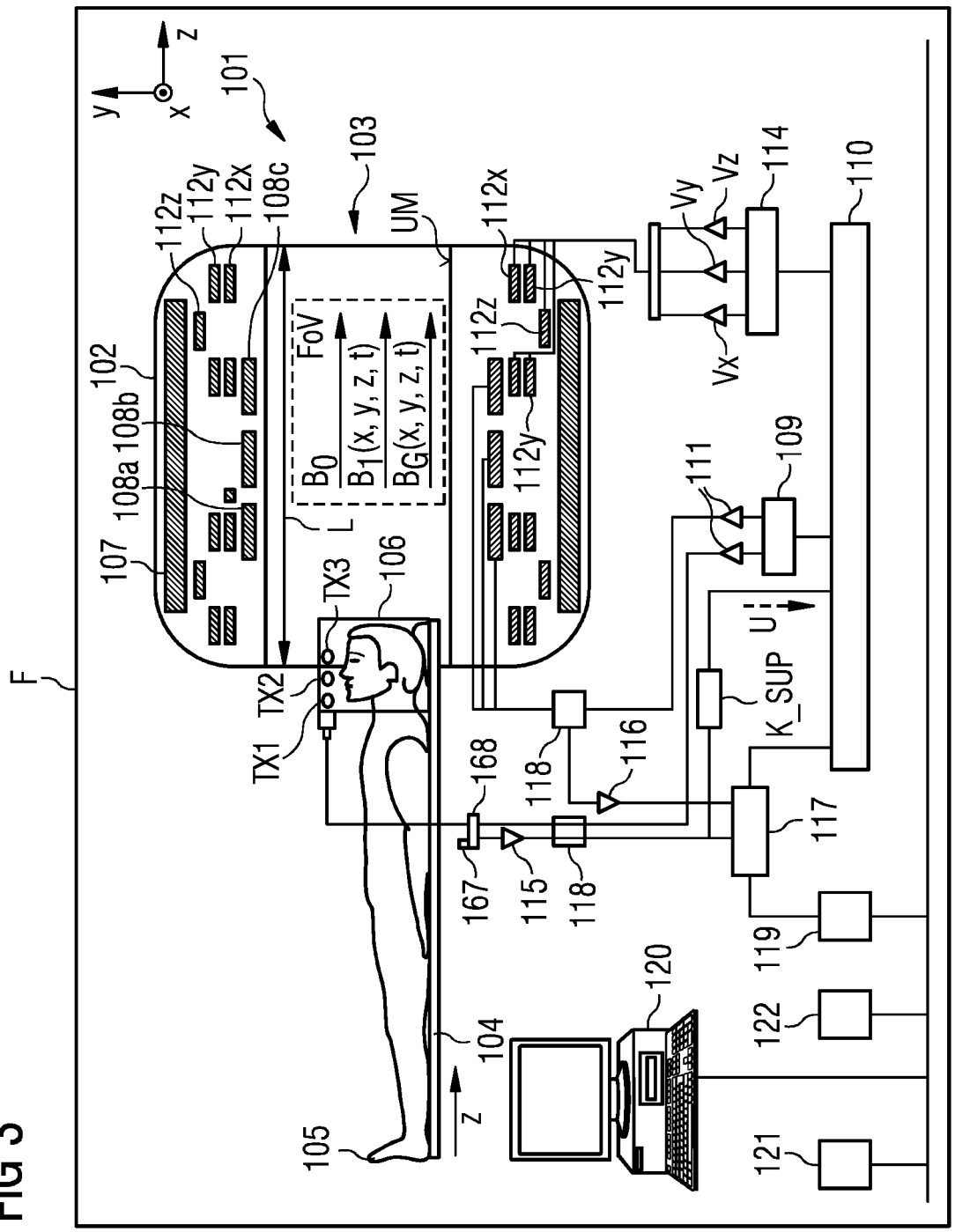
FIG. 3 shows a schematic and simplified representation of one embodiment of a magnetic resonance tomography (MRT) system.

FIG. 3 shows one embodiment of an imaging magnetic resonance device MRT 101 (e.g., included in a shielded room or Faraday cage F) including a hollow cylinder 102 having, for example, a tubular bore 103 into which a patient couch 104 bearing a body 105 (e.g., of an examination object such as a patient; with or without local coil arrangement 106) may be introduced in the direction of the arrow z so that images of the patient 105 may be generated by an imaging method. Disposed on the patient, for example, is a local coil arrangement 106 that may be used in a local region (e.g., a field of view (FOV)) of the MRT 101 to generate images of a subregion of the body 105 in the FOV. Signals of the local coil arrangement 106 may be evaluated (e.g., converted into images, stored or displayed) by an evaluation device (e.g., including elements 168, 115, 117, 119, 120, 121, etc.) of the MRT 101 that may be connected to the local coil arrangement 106 (e.g., via coaxial cable or wirelessly (167), etc.).

When a magnetic resonance device MRT 101 is used in order to examine a body 105 (e.g., an examination object or a patient) by magnetic resonance imaging, different magnetic fields that are coordinated with one another with the utmost precision in terms of temporal and spatial characteristics are radiated onto the body 105. A strong magnet (e.g., a cryomagnet 107) in a measurement chamber having a, for example, tunnel-shaped bore 103 generates a strong static main magnetic field $B_0$ ranging, for example, from 0.2 Tesla to 3 Tesla or more. A body 105 that is to be examined, supported on a patient couch 104, is moved into a region of the main magnetic field B0 that is approximately homogeneous in the area of observation (e.g., FOV). The nuclear spins of atomic nuclei of the body 105 are excited via magnetic radio-frequency excitation pulses B1 (x, y, z, t) that are emitted via a radio-frequency antenna (and/or a local coil arrangement if necessary) that is shown in FIG. 3 in greatly simplified form as a body coil 108 (e.g., multipart body coil 108a, 108b, 108c). Radio-frequency excitation pulses are generated, for example, by a pulse generation unit 109 that is controlled by a pulse sequence control unit 110. Following amplification by a radio-frequency amplifier 111, the pulses are directed to the radio-frequency antenna 108 and/or local coil 106. The radio-frequency system shown is indicated only schematically. In other embodiments, more than one pulse generation unit 109, more than one radio-frequency amplifier 111, and a plurality of radio-frequency antennas 108 a, b, c are used in a magnetic resonance device 101.

The magnetic resonance device 101 also includes gradient coils 112x, 112y, 112z, by which magnetic gradient fields $B_G$ (x, y, z, t) are radiated in the course of a measurement in order to provoke selective slice excitation and for position encoding of the measurement signal. The gradient coils 112x, 112y, 112z are controlled by a gradient coil control unit 114 (and if appropriate, via amplifiers Vx, Vy, Vz) that, like the pulse generation unit 109, are connected to the pulse sequence control unit 110.

Signals emitted by the excited nuclear spins (e.g., of the atomic nuclei in the examination object) are received by the body coil 108 a, b, c and/or at least one local coil arrangement 106, are amplified by assigned radio-frequency pre-amplifiers 116, and are further processed and digitized by a receiving unit 117. The recorded measurement data is digitized and stored in the form of complex numeric values in a k-space matrix. Using a multidimensional Fourier transformation, an associated MR image may be reconstructed from the k-space matrix populated with values.

For a coil that may be operated in both transmit and receive mode (e.g., the body coil 108 or a local coil 106), correct signal forwarding is regulated by an upstream duplexer 118.

From the measurement data, an image processing unit 119 generates an image that is displayed to a user via an operator console 120 and/or stored in a memory unit 121. A central computer unit 122 controls the individual system components.

In MR tomography, images having a high signal-to-noise ratio (SNR) may be acquired by local coil arrangements (e.g., coils, local coils). These are antenna systems that are mounted in direct proximity on (e.g., anterior) or below (e.g., posterior), on, or in the body 105. In the course of an MR measurement, the excited nuclei induce a voltage in the individual antennas of the local coil. The induced voltage is amplified by a low-noise preamplifier (e.g., LNA, preamp) and forwarded to the receive electronics. High-field systems (e.g., 1.5 T-12 T or more) are used to improve the signal-to-noise ratio, even with high-resolution images. If more individual antennas may be connected to an MR receive system than there are receivers present, a switching matrix (e.g., referred to or implemented as RCCS), for example, is incorporated between receive antennas and receivers. This routes the currently active receive channels (e.g., the receive channels currently lying in the FOV of the magnet) to the receivers present. This enables more coil elements to be connected than there are receivers available, since in the case of whole-body coverage, only the coils that are located in the FOV or in the homogeneity volume of the magnet may be read out.

The term local coil arrangement 106 serves generally to describe, for example, an antenna system that may include, for example, one antenna element or a plurality of antenna elements (e.g., coil elements) configured as an array coil. These individual antenna elements are embodied, for example, as loop antennas (e.g., loops), butterfly coils, flex coils or saddle coils. A local coil arrangement includes, for example, coil elements, a preamplifier, further electronics (e.g., standing wave traps, etc.), a housing, supports, and may include a cable with plug-type connector by which the local coil arrangement is connected to the MRT system. A receiver 168 mounted on the MRT system side filters and digitizes a signal received, for example, wirelessly, etc. by a local coil 106 and passes the data to a digital signal processing device that may derive an image or a spectrum from the data acquired by a measurement and makes the derived image or spectrum available to the user (e.g., for subsequent diagnosis by the user and/or for storage in a memory).

For signal excitation in magnetic resonance (MR) scanners of the latest generation, multiple transmit channels and elements (e.g., in one or more local coils) are used simultaneously in accordance with known methods. This may also be the parallel transmit (pTX) method. Safe operation for the patient may only be provided if the specific absorption rate (SAR) dose is known in terms of temporal and spatial characteristics.

A pTX system enables phase and amplitude of each transmit element to be freely set, so that the calculation of the SAR limits is a complex task. Depending on the phase length and amplitude, SAR hotspots may occur in the tissue. The SAR hotspots are influenced by the individual patient physiology (e.g., cysts or tumors).

In the case of known single-channel transmit systems, a "K-factor" is determined based on a finite element (FE) simulation and validation measurements. This describes the SAR dose per time and amplitude unit (e.g., in the worst case, in the SAR hotspot of the local coil). Taking into consideration a safety margin (e.g., at least a factor of 2), the usable RF power is restricted by the k-factor to the legally prescribed limit (e.g., lookahead or online supervision).

In pTX systems, an analog method, in which the safety margin is scaled with the number of the channels, is known. This takes account of the risk of a worst case overlay of the SAR hotspots of the transmit elements in the patient. A disadvantage is that the potential advantages of the pTX system may not be exploited because of the high safety margins.

A further method (e.g., virtual observation points (VOP) method), in which the SAR limits are predicted by the use of a parameterizable patient model, is known. The model is determined by a series of FE-based simulation calculations. For this, the SAR hotspots in the patient tissue are calculated (e.g., several models with different size, sex, age, etc.) based on the electromagnetic fields that are generated by the transmit elements. One advantage is that the necessary safety margins may turn out to be significantly less compared to the K-factor approach (and do not increase linearly with the number of transmit elements). Since the influence of each transmit element may be represented independently, the SAR in the patient may be calculated with the model for each linear combination of transmit amplitudes and phases (e.g., prior to the measurement and also during the measurement by comparison with measured transmitted and reflected RF amplitudes and phases).

One disadvantage may be the complexity of the method and the associated problems of providing evidence of safe clinical operation.

Movements by the patient during the measurement, the patient's anatomical deviations from a precalculated standard model, and thermal effects in the TX/RX path may lead to a change in the actual SAR hotspots compared to the theoretically assumed hotspots. The greater the number of transmit elements, the stronger such effects may be. In the context of a potential clinical certification, these aspects and others may be analyzed and used for a safe solution.

According to embodiments, a local-coil-specific restriction on the amplitude and phase space of the transmit elements (e.g., antennas TX1, TX2, TX3) of at least one local coil 106 and/or body coil 108 $a$, $b$, $c$ is introduced for a clinical application (e.g., in the form of a transmit vector B1_H, which for a local coil 106, indicates which amplitude/phase combinations the controller 110 of the local coil 106 may send).

Figure 1:
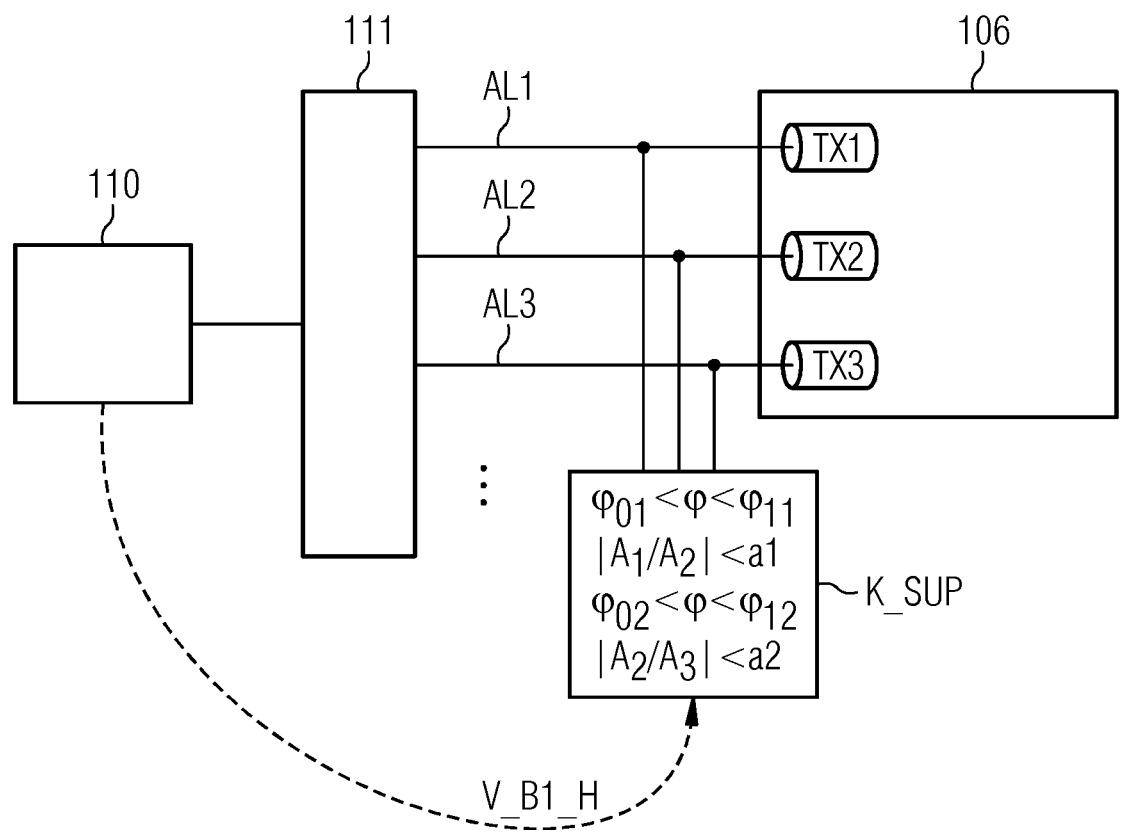
FIG. 1 shows elements of one embodiment of a magnetic resonance tomography (MRT)

FIG. 1 shows in simplified fashion one embodiment of an MRT controller 110 that imposes transmit signals (e.g., with permissible amplitude/phase combinations) on a plurality of antennas TX1, TX2, TX3 of a local coil (e.g., also usable for receipt) using an amplifier 111 (e.g., FRPA). The transmit signals and/or return signals transmitted to the antennas TX1, TX2, TX3 are monitored by a monitoring device K_SUP.

Figure 2:
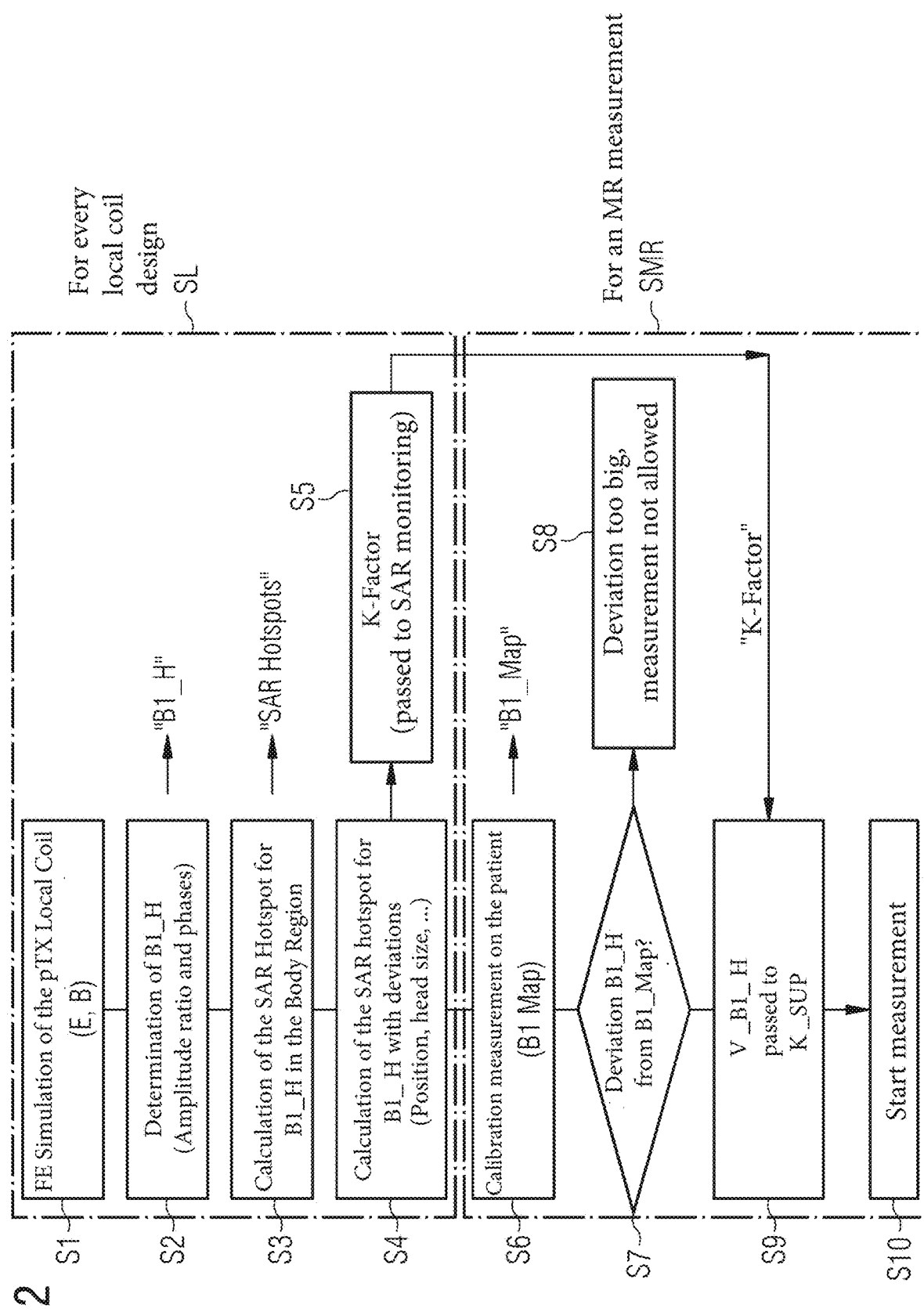
FIG. 2 shows acts of one embodiment of a method.

As FIG. 2 makes clear, the transmit vector B1_H is determined for each local coil 106, for example, initially based on an FE simulation (act S1) and/or a calibration measurement (e.g., on a patient 105 to be examined in the MRT by MRT "measurement") in act S2, and indicates permitted amplitude ratios and phases for the MRT imaging.

A patient-specific calibration measurement is carried out (act S6) on a patient 105 to be examined (e.g., prior to MRT imaging on the patient) using a conservatively calculated SAR dose. A wide variety of methods may be provided for determining the SAR dose on the patient 105 (e.g., microwave thermometry, consideration of phases and amplitudes of forward and return transmit power to/from antennas of the at least one local coil, etc.).

From calibration data obtained with the calibration measurement S6 (e.g., referred to as 'B1 map' or with reference character 'B1_Map' in FIG. 2), the transmit vector B1_H (e.g., for MRT imaging on the patient) may be calculated/optimized such that a B1 excitation that is as homogeneous as possible may take place in the coil volume (e.g., volume within a local coil 106). In addition, the relative deviations of the transmit vector B1_H from the simulated reference value are limited in order to limit resulting overshoots of the SAR (e.g., anatomical deviations may potentially be detectable at this point in the method). The result of these calculations is the vector space V_B1_H.

For example, for magnetic field strengths >3T, such a field homogenization in the imaging volume is an important prerequisite for a clinically acceptable operation of the MR scanner 101.

Because of the overall homogeneous excitation in the imaging volume (e.g., FOV), the calculation of the SAR dose is simplified. Essentially, the classic K-factor approach may be used. For example, the SAR hotspots, calculated in act S3, are calculated based on an FE model of the local coil 106, with a patient model, in the homogeneous excitation mode ('CP mode'). Then, if necessary, SAR hotspots for B1_H are calculated for possible deviations (act S4 in FIG. 2) such as a different possible position of the patient 105 in the MRT 101 and/or for a different possible head size of a patient 105, and a K-factor determined in this way is passed (S5) to an SAR monitoring device S5.

Prior to the start of an imaging measurement (e.g., S10; MRT imaging on the patient), the monitoring vector V_B1_H (e.g., may indicate in which range f01<f<f11, f02<f<f12 angles f and in which ranges |A1/A2|<a1, |A2/A3|<a2 amplitudes A1, A2, A3 and/or amplitude ratios a1, a2 are contained) is passed to the non-measurement-system-dependent monitoring component K_SUP (shown in simplified form in FIG. 1), as indicated in FIG. 2 in act S9.

The monitoring device K_SUP includes, for example, measuring devices for measuring transmitted and reflected RF power of all transmit elements TX1, TX2, TX3, etc. with complete phase accuracy. In an embodiment, the monitoring device K_SUP may be part of an MR receiver in a controller 117 and/or in a local coil 106. In a further embodiment, the monitoring device K_SUP may be part of an autonomous measuring unit with directional couplers and the necessary evaluation circuit or software.

During, for example, a calibration measurement (S6) and/or a total imaging measurement SMR (e.g., examination of a patient with a magnetic resonance tomography device), a monitoring device K_SUP (or each monitoring device if there are several such devices) checks (e.g., in accordance with reference character S7 in FIG. 2) at suitable time intervals (e.g., 10 µs) whether the measured amplitude ratios (e.g., |A1/A2|, |A2/A3| etc.; transmitted) and phases (e.g., f01<f<f11, f02<f<f1<<f12) of the transmit elements TX1, TX2, TX3 lie in the permitted range (e.g., f01<f<f11, f02<f<f1<f12, |A1/A2|<a1, |A2/A3|<a2 etc.). In the event of an error, designated by step S8 in FIG. 2 (e.g., because the patient moves a lot or because of erroneous or impermissible RF pulses), the monitoring unit K_SUP sends an interruption signal to the MR controller 117/110. As an additional error criterion, the reflected power may optionally be used on a connection line AL1, AL2, AL3 of an antenna TX1, TX2, TX3.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance tomography system comprising:
 a controller configured to perform:
  a storing of a transmit vector that is established on a local-coil-specific basis, the transmit vector, for a specific local coil, being indicative of which amplitude ratios and phases transmit elements of the specific local coil are controllable by a transmit device;
  a generation of patient-specific calibration data representing a field distribution, the generation of the patient-specific calibration data comprising initiation of a patient-specific calibration measurement on a patient; and
  a determination of deviations in the patient-specific calibration data from the stored transmit vector established on a local-coil-specific basis, the patient-specific calibration data being generated in the patient-specific calibration measurement on the patient and representing a field distribution, wherein an imaging MRT measurement is not allowed when the deviations exceed a threshold value; and
 a monitoring device configured to monitor the imaging MRT measurement when the imaging MRT measurement is performed, when the deviations do not exceed the threshold value.

2. The magnetic resonance tomography system of claim 1, wherein the monitoring device is configured to measure transmitted, reflected, or transmitted and reflected radio frequency power of the transmit elements.

3. The magnetic resonance tomography system of claim 1, wherein the monitoring device is configured to check, during an imaging measurement, whether measured, transmitted, or measured and transmitted amplitude ratios and phases of the transmit elements lie in a predetermined range of amplitude ratios and phases.

4. The magnetic resonance tomography system of claim 1, wherein the monitoring device is configured to check, during an imaging measurement, at regular time intervals, whether measured, transmitted, or measured and transmitted amplitude ratios and phases of the transmit elements lie in a predetermined range of amplitude ratios and phases specified by a monitoring vector.

5. The magnetic resonance tomography system of claim 1, wherein the monitoring device is configured, when a check during an imaging measurement shows that measured, transmitted, or measured and transmitted amplitude ratios and phases of the transmit elements lie outside a predetermined range of amplitude ratios and phases specified by a monitoring vector, to send an interrupt signal to prompt an interruption of the imaging measurement to another controller of the magnetic resonance tomography system.

6. The magnetic resonance tomography system of claim 1, wherein the monitoring device is configured, when a check during an imaging measurement shows that a reflected power at one or more connection lines of the transmit device of the specific local coil lie above a predefined threshold value, to send an interrupt signal to prompt an interruption of the imaging measurement to another controller of the MRT system.

7. The magnetic resonance tomography system of claim 1, wherein the monitoring device is configured as part of a magnetic resonance receiver.

8. The magnetic resonance tomography system of claim 1, wherein the monitoring device is configured as an autonomous measuring unit with directional couplers and an evaluation device.

9. The magnetic resonance tomography system of claim 1, wherein the monitoring device is configured to take account of a monitoring vector that indicates in which range angles and in which ranges amplitudes, amplitude ratios, or amplitudes and amplitude ratios are containable.

10. The magnetic resonance tomography system of claim 1, wherein the monitoring device is configured to compare phases, amplitudes, amplitude ratios, or any combination thereof on at least one connection line of an antenna of the specific local coil with phases, amplitudes, amplitude ratios, or any combination thereof permitted in accordance with a monitoring vector.

11. The magnetic resonance tomography system of claim 1, wherein the controller is configured to:

store at least one established factor occurring per time and amplitude unit and representing a maximum permitted specific absorption rate (SAR) dose in the patient; and pass the at least one established factor to the monitoring device.

12. A method for operating a magnetic resonance tomography (MRT) system, the method comprising:

identifying, by a controller, a stored, established transmit vector that, for a local coil, indicates with which amplitudes and phases, transmit elements of the local coil are controllable by a transmit device;

generating, by the controller, calibration data representing a field distribution, the generating comprising initiating a calibration measurement on a patient; and determining, by the controller, deviations from the calibration data generated in the calibration measurement on the patient and representing a field distribution using the stored, established transmit vector, wherein an imaging MRT measurement is not allowed when the deviations exceed a threshold value, the imaging MRT measurement otherwise being performed and being monitored by a monitoring device.

13. The method of claim 12, further comprising measuring, by the monitoring device, transmitted, reflected, or transmitted and reflected radio frequency (RF) power of the transmit elements.

14. The method of claim 12, further comprising checking, by the monitoring device, during an imaging measurement, whether measured, transmitted, or measured and transmitted amplitude ratios and phases of the transmit elements lie in a predetermined range of amplitude ratios and phases.

15. The method claim 12, further comprising checking, by the monitoring device, during an imaging measurement, at regular time intervals, whether measured, transmitted, or measured and transmitted amplitude ratios and phases of the transmit elements lie in a predetermined range of amplitude ratios and phases specified by a monitoring vector.

16. The method of claim 12, further comprising sending, by the monitoring device, when a check during an imaging measurement shows that measured, transmitted, or measured and transmitted amplitude ratios and phases of the transmit elements lie outside a predetermined range of amplitude ratios and phases specified by a monitoring vector, an interrupt signal to prompt an interruption of the imaging measurement to another controller of the magnetic resonance tomography (MRT) system.

17. The method of claim 12, further comprising sending, by the monitoring device, when a check during an imaging measurement shows that a reflected power at one or more connection lines of the transmit device of the local coil lie above a predefined threshold value, an interrupt signal to prompt an interruption of the imaging measurement to another controller of the magnetic resonance tomography (MRT) system.

18. The method of claim 12, wherein the monitoring device is configured as part of a magnetic resonance (MR) receiver.

* * * * *